(12) United States Patent
Su et al.

(10) Patent No.: US 9,744,745 B2
(45) Date of Patent: Aug. 29, 2017

(54) CIRCUIT SUBSTRATE AND MANUFACTURING METHOD THEREOF

(75) Inventors: Minshe Su, Dongguan (CN); Qianfa Liu, Dongguan (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 388 days.

(21) Appl. No.: 14/368,480

(22) PCT Filed: Dec. 29, 2011

(86) PCT No.: PCT/CN2011/084872
§ 371 (c)(1),
(2), (4) Date: Jun. 24, 2014

(87) PCT Pub. No.: WO2013/097127
PCT Pub. Date: Jul. 4, 2013

(65) Prior Publication Data
US 2014/0322520 A1    Oct. 30, 2014

(51) Int. Cl.
*H05K 3/38*        (2006.01)
*B32B 15/092*    (2006.01)
(Continued)

(52) U.S. Cl.
CPC .............. *B32B 15/092* (2013.01); *B32B 7/12* (2013.01); *B32B 15/08* (2013.01); *B32B 15/20* (2013.01); *B32B 17/064* (2013.01); *H05K 1/0306* (2013.01); *H05K 3/381* (2013.01); *H05K 3/386* (2013.01); *B32B 2457/08* (2013.01); *H05K 3/022* (2013.01); *Y10T 428/25* (2015.01);
(Continued)

(58) Field of Classification Search
None
See application file for complete search history.

(56) References Cited

U.S. PATENT DOCUMENTS 5,472,563 A     12/1995  Kogawa
2004/0037950 A1    2/2004  Scheel et al.

FOREIGN PATENT DOCUMENTS

CN        102548200 A      7/2012
JP        H02234492 A      9/1990
(Continued)

OTHER PUBLICATIONS

Machine translation JP11-330697 (1999).*
(Continued)

*Primary Examiner* — Alexandre Ferre
(74) *Attorney, Agent, or Firm* — Workman Nydegger

(57) ABSTRACT

Provided is a circuit substrate, including a glass film (10) forming a rough layer (11) after surface roughness processing, a resin adhesion (20) located the rough layer (11) on either side of the glass film (10), and a metal foil (30) located on the outside of resin adhesion layer (20). The glass film (10), the resin adhesion layer (20) and the metal foil (30) are joined together through suppressing. The circuit substrate employs the glass film (10) which forms a rough layer (11) after surface roughness processing as a carrier material, so that the resin adhesion layer (20) and the surface of the glass film (10) have a good binding force, and the dielectric constant of the circuit substrate has slight difference in the directions of X, Y and Z. Also provided is manufacturing method for a circuit substrate.

16 Claims, 1 Drawing Sheet

(51) Int. Cl.
    *B32B 17/06*    (2006.01)
    *B32B 7/12*    (2006.01)
    *H05K 1/03*    (2006.01)
    *B32B 15/08*    (2006.01)
    *B32B 15/20*    (2006.01)
    *H05K 3/02*    (2006.01)

(52) U.S. Cl.
    CPC ........ *Y10T 428/251* (2015.01); *Y10T 428/252* (2015.01); *Y10T 428/254* (2015.01); *Y10T 428/256* (2015.01); *Y10T 428/257* (2015.01); *Y10T 428/259* (2015.01); *Y10T 428/266* (2015.01); *Y10T 428/31518* (2015.04)

(56) References Cited

FOREIGN PATENT DOCUMENTS

| | | | |
|---|---|---|---|
| JP | H09172230 A | | 6/1997 |
| JP | 11330697 A | * | 11/1999 |

OTHER PUBLICATIONS

PGO Online Catalagoh: AF45 Alkali Free Thin Glass Specification (available at https://www.pgo-online.com/intl/katalog/AF45.html).*

* cited by examiner

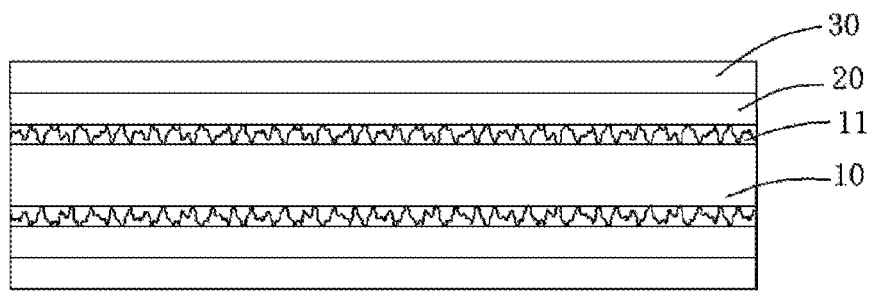

CIRCUIT SUBSTRATE AND MANUFACTURING METHOD THEREOF

TECHNICAL FIELD

The present invention relates to a circuit substrate for a printed circuit and manufacturing method thereof.

BACKGROUND ART

In recent years, with the development of the electronic products towards multi-function and miniaturization, and the development of the circuit substrate used towards multi-layer, high-density of wiring, high modulus and high-speed signal transmission, there is higher requirement for comprehensive performance of circuit substrate, that is, metal clad laminate, such as copper clad laminate.

For example, along with the development of high performance, high function and network of the information and communication equipments, and in order to treat and transmit large-capacity information with high speed, the operating signals tend to be high-frequency, and the electronic products have a rising used frequency, requiring not only the dielectric constant of a circuit substrate is smaller and smaller but also the dielectric constant of a circuit substrate has good stability and uniformity, At present the copper clad laminate generally uses the glass fiber fabric as the reinforcing material. Woven material is used as glass fiber fabric (e.g. glass fiber fabric), due to the weaving in the woven material and the existing cross-type node in cross section of the woven fiber, the insulating medium (such as a glass component) can't distribute evenly and the dielectric constant of the circuit substrate isn't isotropic in X, Y and Z directions (wherein, X, Y and Z directions respectively refers to the direction of the circuit substrate along length, width and thickness), that is, there is the difference of the dielectric constant in X and Y directions. When such high-frequency signal is transmitted in the high frequency circuit substrate, the electromagnetic waves is transmitted not only in the X and Y directions, but also in the Z-direction, the attenuation of the signal is generated because of the difference the dielectric constant in X, Y and Z directions, which influence the stability of the signal transmission. In order to making the signal to transmit evenly and stably, there should be reduce the difference of medium distribution in X, Y and Z directions in the circuit substrate.

In addition, along with the increase of the circuit interconnection density of the electronic products, the requirements for the circuit substrate's dimensional stability become greater and greater; in order to reduce the thermal stress produced in the thermal shock in the process of making circuit substrates and meet the component's precise alignment holes in the installation and assembly process, CTEs (Coefficient of Thermal Expansion) of the circuit substrate in X, Y and Z directions (wherein, X, Y and Z directions respectively refers to the direction of the circuit substrate along length, width and thickness) should be as small as possible. Particularly for the circuit substrate used for IC packages, CTEs in X and Y directions should be close to that of silicon chips (3 ppm/° C.) as possible, because the chips can be damaged by the strong stress-strain produced during the environmental cold-thermal shock if the difference between CTE of the circuit substrate and CTE of the chip packaged in the laminate is too large.

At present, the copper clad laminate (FR-4) usually uses glass fiber fabric as a enhancement material, CTEs of the copper clad laminate in X and Y directions are between 16~18 ppm/° C. due to the ratio between the glass fiber fabric and the resin in the laminates.

In order to reduce CTEs in X and Y directions, U.S. Patent Application US20040037950A1 proposed to use thin glass film to replace the glass fiber fabric to manufacture the copper clad laminate. This patent application declared a multi-layer board by the glass film, a resin layer and a copper layer, but it can't declare how to get good adhesion between the surface of the glass film and the resin layer. Because the surface of the glass film is smooth, a good binding force between the resin layer and the glass film can't be formed, which causes the copper wire along with the resin layer to come off easily from the glass film, which further causes the reliability of the copper clad laminate manufactured by this method is low during the process of assembly and usage, and also can cause the electronic products to be scrapped.

SUMMARY OF THE INVENTION

The object of the present invention is to provide a circuit substrate, which employs a glass film with a rough layer formed by surface-roughing treatment as carrier material, causing the resin adhesion layer have good binding force with the glass film surface.

Another object of the present invention is to provide a circuit substrate manufactured by using the glass film with the rough layers formed by surface-roughing treatment, which have the characteristic of low difference of dielectric constants in X, Y and Z directions.

A further object of the present invention is to provide a method for manufacturing a circuit substrate, wherein a glass film with a rough layers formed by surface-roughing treatment is used as the carrier material. The method has good formability and convenient operation.

To achieve the above-mentioned object, the present invention provides a circuit substrate, comprising a glass film with the rough layers formed by surface-roughing treatment, resin adhesion layers located on both sides of the glass film, and metal foils located outside of the resin adhesion layer, wherein the glass film, the resin adhesion layer and the metal foil are combined together by pressing.

The glass composition of the glass film is an aluminosilicate glass with less than 0.3% (by weight) of the alkali metal oxide or a boron silicate glass with less than 0.3% (by weight) of the alkali metal oxide.

The thickness of the glass film is between 20 µm and 1.1 mm. In order to obtain good binding force between the glass film and the resin adhesion layer, the inventors found that an uneven rough layer with a thickness over a certain value formed on the glass film can improve the binding force between the glass film and the resin adhesion layer. Specifically, when the thickness of the rough layer is equal to 0.3 µm or greater, the satisfying binding force can be obtained. In the present invention, the thickness of the rough layer means ten-point height of irregularities (Rz) of the rough surface.

The surface of the glass film can be roughed by one or more methods selected from napping, frosting, chemical etching, sol-gel and mechanical grinding to increase the contact area and make the glass film and the adhesion layer achieve better binding.

The inventors find that a rough layer with a thickness of equal to 0.3 µm greater can be easily formed on the surface of the glass film by frosting or sol-gel, and the circuit substrate manufactured thereby has good binding force.

The inventors find that, to obtain better binding force between the glass film and the resin adhesion layer and reduce CTE of a circuit substrate, the preference of the thickness of the rough layer is given to from 5 µm to 20 µm and the sum of the thickness of the rough layers on both sides of the glass film can't be over half of the total thickness of the glass film.

The inventors also find that the glass film can obtain better dimensional stability as is treated by high-temperature annealing (400° C.~600° C.).

The resin in the resin adhesion layer is one or more selected from epoxy resin, cyanate ester resin, phenolic resin, polyphenylene ether resin, polybutadiene resin, polybutadiene-styrene copolymer resin, polytetrafluoroethylene resin, polybenzoxazine resin, polyimide, silicon resin, bismaleimide resin, LCP resin (Liquid Crystal Polymer), and bismaleimide triazine resins (BT resin).

The above-mentioned resin adhesion layer can also comprises a powder filler, which has the function of improving dimensional stability and reducing CTE. The powder filler accounts for less than 70% by volume based on the total volume of the resin and the powder filler in resin adhesion layer. The powder filler is one or more selected from crystalline silica, fused silica, spherical silica, strontium titanate, barium titanate, strontium barium titanate, boron nitride, aluminium nitride, silicon carbide, aluminum oxide, titanium dioxide, glass powder, chopped glass fibers, talc powder, mica powder, conductex, carbon nanotube, metal powder, polyphenylene sulfide and PTFE. Wherein, the preference of the powder filler is given to fused silica or titanium dioxide. The median value of the particle size of the powder filler is 0.01-35 µm, preferably 0.1-10 µm. In order to obtain good performance, the surface of the powder filler can be treated, for example, with coupling agent and the like. Said resin adhesion layer also comprises an additive including emulsifier, dispersant etc.

The material of the metal foil comprises copper, aluminum, nickel, or alloys thereof.

The present invention also provides a manufacturing method of the circuit substrate, which comprises the following steps:
Step 1: providing a glass film, and subjecting the glass film to surface-roughing treatment to form a rough layer;
Step 2: laminating one or more prepregs on both sides of the glass film formed with the rough layer, separately;
Step 3: laminating one metal foil on the side of each prepreg against the glass film separately;
Step 4: putting the laminated layers into the presser machine for hot pressing at a curing temperature ranging from 100° C.~400° C. and a curing pressure ranging from 10 Kg/cm²~65 Kg/cm², to obtain the circuit substrate.

In the step 1 of the above-mentioned manufacturing method, the surface of said glass film is roughed by one or more methods selected from napping, frosting, chemical etching, sol-gel and mechanical grinding and the thickness of the rough layer is equal to 0.3 µm or greater.

In the step 1 of the above-mentioned manufacturing method, it is also comprised that a coupling agent is used to treat on the rough surface of the glass film, wherein the coupling agent is selected from a silane coupling agent and a titanate ester coupling agent.

In the step 1 of the above-mentioned manufacturing method, it is also comprised that the glass film is treated with high-temperature annealing at 400° C.~600° C. prior to the surface-roughing treatment to the glass film.

The present invention also provides another manufacturing method of the circuit substrate, which comprises the following steps:
Step 1: providing a glass film treated by surface-roughing to form the rough layers;
Step 2: aminating one resin-coated metal foil on each side of the glass film formed with the rough layer separately;
Step 3: putting the laminated layers into the presser machine for hot pressing at a curing temperature ranging from 100° C.~400° C. and a curing pressure ranging from 10 Kg/cm²~65 Kg/cm² to obtain the circuit substrate.

In the step 1 of the above-mentioned manufacturing method, the surface of said glass film is roughed by one or more methods selected from napping, frosting, chemical etching, sol-gel and mechanical grinding and the thickness of the rough layer formed thereby is equal to 0.3 µm or greater.

In the step 1 of the above-mentioned manufacturing method, it is also comprised that a coupling agent is used to treat on the rough surface of the glass film, wherein the coupling agent is selected from a silane coupling agent and a titanate ester coupling agent.

In the step 1 of the above-mentioned manufacturing method,

Compared with prior art, the advantages of the present invention are:
first, a glass film subjected to surface-roughing treatment is used as the carrier material, causing the resin adhesion layer has good binding force with the glass film;
second, the circuit substrate manufactured by using the glass film with a certain thickness of the rough layer formed by surface-roughing treatment, has the characteristic of low difference of dielectric constants in X, Y and Z directions;
third, controlling the number of the glass films to make the glass in the circuit substrate accounts for more than 45% by volume based on the sum of volume of the glass and the resin adhesion layer, causing the CTEs in X, Y and Z directions of the circuit substrate reduced compared with the copper clad laminate using glass fiber fabric as reinforcing material in the prior art;
in addition, the circuit substrate of the present invention has the advantage of simple process and easy mass production.

In order to further illustrate the technical means for achieving the intended object and the effects, the present invention will be described below by referring to the detailed description and the accompanying drawings, from which the objects, features and characters of the invention will be deeply and specifically understood. It should be noted that the accompanying drawings are only for reference and explaining, not making any limit to the invention.

BRIEF DESCRIPTION OF THE DRAWING

The technical solutions of the present invention and the beneficial effects thereof will be clear by describing the specific embodiments in detail referring to the accompanying drawings.

Wherein,

FIG. 1 is a structural diagram of a circuit substrate of the present invention.

DETAILED DESCRIPTION

As FIG. 1 shows, the circuit substrate of the present invention comprises a glass film (10) with the rough layers

(11) treated by surface-roughing, the resin adhesion layer (20) located on both rough layers (11) of the glass film (10), and the metal foil (30) located in the outside of resin adhesion layer (20), the glass film, the resin adhesion layer (20) and the metal foil (30) are combined by pressing.

Said glass composition of the glass film (10) is aluminosilicate glass with the alkali metal oxide accounting for less than 0.3% (by weight) or boron silicate glass with the alkali metal oxide accounting for less than 0.3% (by weight).

The thickness of said glass film (10) is between 20 µm and 1.1 mm.

In order to obtain good binding force between the glass film (10) and the resin adhesion layer (20), the inventors found that an uneven rough layer (11) with a thickness over a certain value formed on the glass film (10) can improve the binding force between the glass film (10) and the resin adhesion layer (20). Specifically, when the thickness of the rough layer (11) is equal to 0.3 µm or greater, the satisfying binding force can be obtained. In the present invention, the thickness of the rough layer (11) means ten-point height of irregularities (Rz) of the rough surface.

The surface of the glass film (10) can be roughed by one or more methods selected from napping, frosting, chemical etching, sol-gel and mechanical grinding to increase the contact area and make the glass film (10) and the adhesion layer (20) achieve better binding.

The inventors find that a rough layer (11) with a thickness of equal to 0.3 µm greater can be easily formed on the surface of the glass film (10) by frosting or sol-gel, and the circuit substrate manufactured thereby has good binding force.

To obtain better binding force between the glass film (10) and the resin adhesion layer (20) and reduce CTE of a circuit substrate, the preference of the thickness of the rough layer (11) is given to from 5 µm to 20 µm and the sum of the thickness of the rough layers (11) on both sides of the glass film (10) can't be over half of the total thickness of the glass film (10).

In addition, the inventors also find that the glass film (10) can obtain better dimensional stability as is treated by high-temperature annealing (400° C.~600° C.) prior to the surface-roughing treatment to the glass film (10).

The resin in the resin adhesion layer (20) is one or more selected from epoxy resin, cyanate ester resin, phenolic resin, polyphenylene ether resin, polybutadiene resin, polybutadiene-styrene copolymer resin, polytetrafluoroethylene resin, polybenzoxazine resin, polyimide, silicon resin, bismaleimide resin, LCP resin (Liquid Crystal Polymer), and bismaleimide triazine resins (BT resin).

The inventors find that, using a coupling agent to treat on the rough surface (11) of the glass film (10) can further improve the binding force between glass film (10) and resin adhesion layer (20). The coupling agent is selected from a silane coupling agent or a titanate ester coupling agent, wherein the preference of the coupling agent is given to a coupling agent having a functional group which can react with the resin.

The resin adhesion layer (20) can also comprises a powder filler, which has the function of improving dimensional stability and reducing CTE. The powder filler accounts for less than 70% by volume based on the total volume of the resin and the powder filler in resin adhesion layer (20). The powder filler is one or more selected from crystalline silica, fused silica, spherical silica, strontium titanate, barium titanate, strontium barium titanate, boron nitride, aluminium nitride, silicon carbide, aluminum oxide, titanium dioxide, glass powder, chopped glass fibers, talc powder, mica powder, conductex, carbon nanotube, metal powder, polyphenylene sulfide and PTFE. Wherein, the preference of the powder filler is given to fused silica or titanium dioxide. The median value of the particle size of the powder filler is 0.01-35 µm, preferably 0.1-10 µm. In order to obtain good performance, the surface of the powder filler can be treated, for example, with coupling agent and the like. Said resin adhesion layer also comprises an additive including emulsifier, dispersant etc.

The material of the metal foil 30 comprises copper, aluminum, nickel, or alloys thereof.

The present invention also provides a manufacturing method of the circuit substrate, which comprises the following steps:

Step 1: providing a glass film, and subjecting the glass film to surface-roughing treatment to form a rough layer;

Step 2: laminating one or more prepregs on both sides of the glass film formed with the rough layer, separately;

Step 3: laminating one metal foil on the side of each prepreg against the glass film separately;

Step 4: putting the laminated layers into the presser machine for hot pressing at a curing temperature ranging from 100° C.~400° C. and a curing pressure ranging from 10 Kg/cm$^2$~65 Kg/cm$^2$, to obtain the circuit substrate.

In the step 1 of the above-mentioned manufacturing method, the surface of said glass film is roughed by one or more methods selected from napping, frosting, chemical etching, sol-gel and mechanical grinding and the thickness of the rough layer is equal to 0.3 µm or greater, in order to increase the contact area, causing the glass film and the resin adhesion layer achieve better binging. Preferably, the surface of the glass film is roughed by frosting or sol-gel process.

In the step 1 of the above-mentioned manufacturing method, it is also comprised that a coupling agent is used to treat on the rough surface of the glass film, which can further improve the binding force between the glass film and the the adhesion layer. The coupling agent is selected from a silane coupling agent and a titanate ester coupling agent, wherein the preference of the coupling agent is given to the coupling agent with the functional group which can react with the resin.

In this manufacturing method, said resin coated metal foil is manufactured by coating resin on metal foil, and said resin is one or more selected from epoxy resin, cyanate ester resin, a phenol resin, a polyphenylene ether resin, allyl resin, polybutylene resin, polybutadiene-styrene copolymer resin, polytetrafluoroethylene resin, polybenzoxazine resin, polyimide, silicon resin, bismaleimide resin, LCP (Liquid Crystal Polymer) resins and a bismaleimide triazine resin (BT resin).

The present invention also provides another manufacturing method of the circuit substrate, which comprises the following steps:

Step 1: providing a glass film treated by surface-roughing to form the rough layers;

Step 2: aminating one resin-coated metal foil on each side of the glass film formed with the rough layer separately;

Step 3: putting the laminated layers into the presser machine for hot pressing at a curing temperature ranging from 100° C.~400° C. and a curing pressure ranging from 10 Kg/cm$^2$~65 Kg/cm$^2$ to obtain the circuit substrate.

In the step 1 of the above-mentioned manufacturing method, the surface of said glass film is roughed by one or more methods selected from napping, frosting, chemical etching, sol-gel and mechanical grinding and the thickness of the rough layer is equal to 0.3 μm or greater, in order to increase the contact area, causing the glass film and the resin adhesion layer achieve better bingding. Preferably, the surface of the glass film is roughed by frosting or sol-gel process.

In the step 1 of the above-mentioned manufacturing method, it is also comprised that a coupling agent is used to treat on the rough surface of the glass film, which can further improve the binding force between the glass film and the the adhesion layer.

The coupling agent is selected from a silane coupling agent and a titanate ester coupling agent, wherein the preference of the coupling agent is given to the coupling agent with the functional group which can react with the resin.

In this manufacturing method, said resin coated metal foil is manufactured by coating resin on metal foil, and said resin is one or more selected from epoxy resin, cyanate ester resin, a phenol resin, a polyphenylene ether resin, allyl resin, polybutylene resin, polybutadiene-styrene copolymer resin, polytetrafluoroethylene resin, polybenzoxazine resin, a polyimide, a silicon resin, bismaleimide, LCP (Liquid CrystalPolymer) resins and a bismaleimide triazine resin (BT resin).

The above mentioned circuit substrate is further described referring to the following examples:

Example 1

Take an aluminosilicate glass film with thickness of 30 μm, wash the surface of the glass film with alcohol, and put the glass film into a solution which comprises 40.2 parts by weight of hydrofluoric acid, 26.8 parts by weight of ammonium fluoride, 3.9 parts by weight of sulphuric acid, and 29.1 parts by weight of deionized water. After sock the glass film at room temperature for 50 minutes, take it out and wash it with water. After dry the glass film in air, treat it using coupling agent, the testing result showing a rough layer with a thickness of 6 μm is formed on each side of the glass film separately.

On each side of the glass film formed with a rough layer, put a FR4 prepreg (that is, prepreg used for S1141 copper clad laminate of Guangdong Shengyi Sci. Tech Co., Ltd.) manufactured by impregnating a glass fibre fabric having a thickness of 0.06 mm (1080 glass fibre fabric) into epoxy resin glue system (dicyandiamide curing agent) and conduct laminating; then on each side put a copper foil and conduct laminating again.

Put the above-mentioned laminated layers into a presser machine at a curing temperature of 180° C. and a curing pressure of 15 Kg/cm$^2$ in vacuum. Conduct hot pressing to obtain a circuit substrate (that is, copper clad laminate). Test the circuit substrate: the peel strength between the copper foil and the prepreg is 1.7 N/mm and that between the prepreg and the glass film is 1.9 N/mm; the CTEs before reaching the glass-transition temperature is 6.58 ppm/° C. and 6.6 ppm/° C. in X and Y directions, separately.

Example 2

Take an aluminosilicate glass film with thickness of 100 μm subjected to high-temperature annealing at 500° C., wash the surface of the glass film with alcohol, and put the glass film into a solution which comprises 22.1 parts by weight of hydrofluoric acid, 23 parts by weight of ammonium fluoride, 37.2 parts by weight of hydrochloric acid, and 17.7 parts by weight of deionized water. After sock the glass film at room temperature for 120 minutes, take it out and wash it with water. After dry the glass film in air, treat it using coupling agent, the testing result showing a rough layer with a thickness of 15 μm is formed on each side of the glass film separately.

On each side of the glass film formed with a rough layer, put a FR4 prepreg (that is, prepreg used for S1141 copper clad laminate of Guangdong Shengyi Sci. Tech Co., Ltd.) manufactured by impregnating a glass fibre fabric having a thickness of 0.06 mm (1080 glass fibre fabric) into epoxy resin glue system and conduct laminating; then on each side put a copper foil and conduct laminating again.

Put the above-mentioned laminated layers into a presser machine at a curing temperature of 180° C. and a curing pressure of 15 Kg/cm$^2$ in vacuum. Conduct hot pressing to obtain a circuit substrate (that is, copper clad laminate). Test the circuit substrate: the peel strength between the copper foil and the prepreg is 1.7 N/mm and that between the prepreg and the glass film is 1.1 N/mm; the CTEs before reaching the glass-transition temperature is 5.8 ppm/° C. and 6.1 ppm/° C. in X and Y directions, separately.

Example 3

To an container put into a solution which comprises 45.1 parts by weight of water glass (sodium silicate), 37.2 parts by weight of hydrochloric acid, and 17.7 parts by weight of deionized water, heat the solution to about 40° C. and be stir the solution for 30 minutes to obtain a reaction liquid. Then stir the reaction liquid slowly for 24~48 hours to obtain an immersion liquid. Take a borosilicate glass film with thickness of 100 μm, wash it thoroughly and put it into the immersion liquid for 30~40 seconds to obtain a gel layer. Raise the glass film with a constant velocity of 5~25 cm/min and then dry the glass film at 110~150° C. for 20~30 minutes. Subject it to a heat treatment at 400~590° C. for 30 minutes, followed by the natural cooling to room temperature. Wash the glass film with water, dry it in air and treat it with a coupling agent, test result showing the rough layer with thickness of 18 μm formed on each side of the glass film separately.

On each side of the glass film formed with a rough layer, put a FR4 prepreg (that is, prepreg used for S1141 copper clad laminate of Guangdong Shengyi Sci. Tech Co., Ltd.) manufactured by impregnating a glass fibre fabric having a thickness of 0.06 mm (1080 glass fibre fabric) into epoxy resin glue system and conduct laminating; then on each side put a copper foil and conduct laminating again.

Put the above-mentioned laminated layers into a presser machine at a curing temperature of 180° C. and a curing pressure of 15 Kg/cm$^2$ in vacuum. Conduct hot pressing to obtain a circuit substrate (that is, copper clad laminate). Test the circuit substrate: the peel strength between the copper foil and the prepreg is 1.7 N/mm and that between the prepreg and the glass film is 1.1 N/mm; the CTEs before reaching the glass-transition temperature is 5.8 ppm/° C. and 6.1 ppm/° C. in X and Y directions, separately.

Comparison Example 1

Impregnate five glass fibre fabrics with thickness of 0.1 mm (2116 glass fibre fabric) into epoxy resin glue system (dicyandiamide curing agent) to obtain FR4 prepreg (that is, prepreg used for S1141 copper clad laminate in Guangdong Shengyi Sci. Tech Co., Ltd.) and conduct laminating. Then on each side put a copper foil and conduct laminating again.

Put the laminated layers into a presser machine wherein the curing temperature is 180° C. and the curing pressure is 25 Kg/cm² in vacuum. Conduct hot pressing to obtain a circuit substrate (that is, copper clad laminate). Test the circuit substrate: the peel strength between the resin layer and the glass film is 1.75 N/mm; the CTEs before reaching the glass-transition temperature are 17.6 ppm/° C. and 17.3 ppm/° C. in X and Y directions, respectively.

Comparison Example 2

Take a glass film with thickness of 60 on each side of the glass film put a FR4 prepreg (that is, prepreg used for S1141 copper clad laminate of Guangdong Shengyi Sci. Tech Co., Ltd.) manufactured by impregnating a glass fibre fabric having a thickness of 0.06 mm (1080 glass fibre fabric) into epoxy resin glue system (dicyandiamide curing agent) and conduct laminating; then on each sides put a copper foil and conduct laminating again.

Put the laminated layers into a presser machine wherein the curing temperature is 180° C. and the curing pressure is 15 Kg/cm² in vacuum. Conduct hot pressing to obtain a circuit substrate (that is copper clad laminate). Test the circuit substrate: the copper foil adheres to the prepreg but peel off from the glass film, showing the peel strength is 0.1 N/mm; the CTEs before reaching the glass-transition temperature are 6.3 ppm/° C. and 6.3 ppm/° C. in X and Y directions, respectively.

As can be known from Examples 1-3, the circuit substrates manufactured from the glass film subjected to surface-roughing treatment not only reduce CTE of circuit substrate in X, Y direction, but have good peel strength. Meanwhile, in Examples 1-3, the glass accounts for more than 45% by volume based on the sum of volume of the glass and the resin adhesion layer due to the use of a glass film, thereby the circuit substrate can have good peel strength and good CTEs in X and Y directions at the same time.

As can be known from Comparison Example 1, CTEs of the traditional FR-4 copper clad laminate in X and Y directions are apparently higher than those of Examples 1-3, because it uses glass fibre fabric as the reinforcing material, does not use the glass film which can improve glass percentage in copper clad laminate.

As can be known from Comparison Example 2, the copper clad laminate can peel off easily and has limited usefulness because it does no use a glass film subjected to surface-roughing treatment.

Example 4

Take a glass film subjected to surface-roughing treatment as shown in Example 2, on each side of the glass film put a resin-coated copper (RCC) coated by epoxy resin with thickness of 50 μm and conduct laminating.

Put the laminated layers into a presser machine wherein the curing temperature is 180° C. and the curing pressure is 15 Kg/cm² in vacuum. Conduct hot pressing to obtain a circuit substrate (that is copper clad laminate). Test the circuit substrate: the peel strength between the resin layer and the glass film is 1.8 N/mm; the CTE before reaching the glass-transition temperature is 6.3 ppm/° C. in either X or Y direction; the dielectric constant is 5.32 (10 GHz) in either X or Y direction and 5.37 (10 GHz) in Z direction, and the dielectric loss angle tangent is 0.008 (10 GHz).

Comparison Example 3

Impregnate five glass fibre fabrics with thickness of 0.1 mm (2116 glass fibre fabric) into epoxy resin glue system (dicyandiamide curing agent) to obtain FR4 prepreg (that is, prepreg used for S1141 copper clad laminate in Guangdong Shengyi Sci. Tech Co., Ltd.) and conduct laminating. Then on each side put a copper foil and conduct laminating again.

Put the laminated layers into a presser machine wherein the curing temperature is 180° C. and the curing pressure is 25 Kg/cm² in vacuum. Conduct hot pressing to obtain a circuit substrate (that is, copper clad laminate). Test the circuit substrate: the peel strength between the resin layer and the glass film is 1.75 N/mm; the CTEs before reaching the glass-transition temperature are 17.6 ppm/° C. and 17.3 ppm/° C. in X and Y directions, respectively; the dielectric constant is 4.11 (10 GHz) in either X or Y direction and 4.42 (10 GHz) in Z direction; and the dielectric loss angle tangent is 0.025 (10 GHz).

In above-mentioned embodiments and comparison examples, the copper clad laminate is tested by reference to IPC4101 standard and the dielectric property in X, Y direction is tested by reference IPC-TM650-2.5.5.13 method under state A and 10 GHz; the dielectric property in Z direction is tested by reference IPC-TM650-2.5.5.6 method under state A and 10 GHz.

In Example 4, the circuit substrate is manufactured by corporately using a resin-coated copper foil and a porous glass film, obtaining good peel strength and low CTE in either X or Y direction. Because in the substrate the glass content is larger than 45% by volume, thereby the substrate has good peel strength and low CTEs in X and Y directions. Meanwhile, it has small difference of the dielectric constant in X, Y, Z direction merely with 0.04. On the contrary, the circuit substrate in Comparison Examples 3 manufactured by using glass fibre fabric has low content of glass, thus the CTEs in X, Y and Z directions are large, and there is large difference of dielectric constant of 0.31 in X, Y and Z directions.

The circuit substrates manufactured in the above manners not only can be used as base material of a circuit board but also can used for optical waveguide path.

Those skilled in the art can make numerous modifications and changes according to the technical solution and spirit of the present invention, all of which fall into the protected scope as prescribed by the claims of the present application.

What is claimed is:

1. A circuit substrate, comprising a glass film with roughened layers on both sides formed by a surface roughening treatment, resin adhesion layers located on each of the roughened layers, and metal foils located outside of the resin adhesion layers, wherein the glass film, the resin adhesion layers and the metal foils are combined by pressing, and wherein the thickness of each of the roughened layers is from 5 μm to 20 μm and the sum of the thickness of the roughened layers of both sides of the glass film is not over ½ of the thickness of the glass film.

2. The circuit substrate of claim 1, wherein glass composition of the glass film is aluminosilicate glass with the alkali metal oxide accounting for less than 0.3% by weight or boron silicate glass with the alkali metal oxide accounting for less than 0.3% by weight.

3. The circuit substrate of claim 1, wherein the thickness of the glass film is from 20 μm to 1.1 mm.

4. The circuit substrate of claim 1, wherein the resin in the resin adhesion layer is one or more selected from epoxy resin, cyanate ester resin, phenolic resin, Polyphenylene ether resin, polybutadiene resin, polybutadiene-styrene copolymer resin, polytetrafluoroethylene resin, polybenzoxazine resin, polyimide, silicon resin, bismaleimide triazine resin, LCP resin(Liquid Crystal Polymer), and bismaleimide resins.

5. The circuit substrate of claim 1, wherein the resin adhesion layer comprises a powder filler, and the amount of the powder filler is less than 70% by volume based on the total volume of the resin and the powder filler in resin adhesion layer, and the powder filler is one or more selected from crystalline silica, fused silica, spherical silica, strontium titanate, barium titanate, strontium barium titanate, boron nitride, aluminium nitride, silicon carbide, aluminum oxide, titanium dioxide, glass powder, chopped glass fibers, talc powder, mica powder, carbon nanotube, metal powder, polyphenylene sulfide and PTFE, and wherein the median value of the particle size of the powder filler is from 0.01 to 35 μm.

6. The circuit substrate of claim 1, wherein the material of the metal foil is copper, aluminum, nickel, or alloys thereof.

7. A manufacturing method of the circuit substrate of claim 1, wherein the manufacturing method comprises the following steps:
providing a glass film, and subjecting the glass film to surface roughening treatment to form a roughened layer on each side of the glass film;
laminating one or more prepregs on each side of the glass film formed with the roughened layers, separately;
laminating one metal foil on the side of the prepregs against the glass film separately; and
putting the laminated layers into a presser machine for hot pressing at a curing temperature ranging from 100° C.~400° C. and a curing pressure ranging from 10 Kg/cm²~65 Kg/cm², to obtain the circuit substrate.

8. The manufacturing method of the circuit substrate of claim 7, wherein in the step 1, the surface of the glass film is roughened by one or more methods selected from napping, frosting, chemical etching, sol-gel and mechanical grinding and the thickness of the roughened layer is equal to 0.3 μm or greater.

9. The manufacturing method of the circuit substrate of claim 7, wherein step 1 further comprises using a coupling agent to treat the roughened surfaces of the glass film, the coupling agent being selected from a silane coupling agent and a titanate ester coupling agent.

10. The manufacturing method of the circuit substrate of claim 7, wherein step 1 further comprises treating the glass film with high-temperature annealing at 400° C.~600° C. prior to the surface-roughening treatment to the glass film.

11. A manufacturing method of the circuit substrate of claim 1, wherein the manufacturing method comprises the following steps:
providing a glass film treated by surface roughening to form the roughened layers;
aminating one resin-coated metal foil on each side of the glass film formed with the roughened layer separately; and
putting the laminated layers into a presser machine for hot pressing at a curing temperature ranging from 100° C.~400° C. and a curing pressure ranging from 10 Kg/cm²~65 Kg/cm² to obtain the circuit substrate.

12. The manufacturing method of the circuit substrate of claim 11, wherein in the step 1, the surfaces of the glass film are roughened by one or more methods selected from napping, frosting, chemical etching, sol-gel and mechanical grinding and the thickness of each roughened layer is equal to 0.3 μm or greater.

13. The manufacturing method of the circuit substrate of claim 11, wherein step 1 further comprises using a coupling agent to treat the roughened surfaces of the glass film, the coupling agent being selected from a silane coupling agent and a titanate ester coupling agent.

14. The manufacturing method of the circuit substrate of claim 11, wherein step 1 further comprises treating the glass film with high-temperature annealing at 400° C.~600° C. prior to the surface-roughening treatment to the glass film.

15. A circuit substrate, comprising:
a glass film with roughened layers on both sides formed by a surface-roughening treatment;
resin adhesion layers located on each of the roughened layers; and
metal foils located outside of the resin adhesion layers,
wherein the glass film, the resin adhesion layers and the metal foils are combined by pressing,
wherein the thickness of each of the roughened layers is from 5 μm to 20 μm and the sum of the thickness of the roughened layers of both sides of the glass film is not over ½ of the thickness of the glass film,
wherein the peel strength between the glass film and the resin adhesion layers is within a range of about 1.1 N/mm to about 1.9 N/mm.

16. The circuit substrate of claim 15, wherein the coefficients of thermal expansion in X and Y directions of the circuit substrate are each within a range of about 5.8 ppm/° C. to a level less than about 17 ppm/° C.

* * * * *